US005084649A

United States Patent [19]

Sasao

[11] Patent Number: 5,084,649

[45] Date of Patent: Jan. 28, 1992

[54] FILTER FOR VISUAL DISPLAY DEVICES AND THE METHOD OF ITS MANUFACTURE

[75] Inventor: Minoru Sasao, Tokyo, Japan

[73] Assignee: Pioneer Electronic Corporation, Tokyo, Japan

[21] Appl. No.: 535,682

[22] Filed: Jun. 11, 1990

[30] Foreign Application Priority Data

Dec. 26, 1989 [JP] Japan ................................ 1-334925

[51] Int. Cl.[5] ...................... H01J 29/10; H05K 9/00; B32B 3/30; B32B 27/12

[52] U.S. Cl. .................................... 313/474; 313/478; 358/252; 428/68

[58] Field of Search ............... 313/469, 474, 473, 478; 358/252, 253; 445/36, 44

[56] References Cited

U.S. PATENT DOCUMENTS 3,898,509 8/1975 Brown, Jr. et al. ................. 313/478
4,562,481 12/1985 Trakas ................................ 358/252
4,631,214 12/1986 Hasegawa ............................ 428/68
4,661,856 4/1987 Schnack ............................. 358/252
4,745,518 5/1988 Fang ................................... 358/252
4,755,716 7/1988 Hayafune et al. .................. 313/479
4,945,282 7/1990 Kawamura et al. ............... 313/478

*Primary Examiner*—Leo H. Boudreau
*Attorney, Agent, or Firm*—Sughrue, Mion, Zinn, Macpeak & Seas

[57] ABSTRACT

A filter consists of a base made of transparent thermoplastic resin and of a black meshed screen made of such resins as nylon and polyester. The black meshed screen, which is coated with carbon, is heated and pressed against the transparent base to embed it in one side of the base. The base is then heated and deformed into a convex shape so that the side where the black meshed screen is embedded is expanded. The deformed base is cooled while it is kept in the convex shape. As a result, a number of indented portions enclosed by the individual meshes are formed in the base because of a difference in thermal shrinkage coefficient between the base and the meshed screen. When external light is radiated against the filter, the indented portions on the base scatter the light, thus reducing the unwanted glare on the CRT screen. The carbon coated on the meshed screen absorbs incoming external light, further enhancing the glare prevention effect of the filter. The black meshed screen also contributes to a substantial improvement in the contrast of the displayed picture.

3 Claims, 3 Drawing Sheets

PRIOR ART

FILTER FOR VISUAL DISPLAY DEVICES AND THE METHOD OF ITS MANUFACTURE

BACKGROUND OF THE INVENTION

The present invention relates to a filter used on visual display devices and the method of manufacturing thereof. More specifically, it relates to a visual display filter mounted on the screen of such display apparatuses as cathode ray tubes (CRT) to scatter the reflected rays of external incident light and thereby enhance the glare suppression effect, and also to the method of manufacturing such a filter.

PRIOR ART

In general, a display device such as CRT used on television receivers has an almost square face panel 1 with a fluorescent screen attached on the inside, as shown in FIG. 6. Another integral part of the display device is an electron gun 3, which is mounted on the rear side of the face panel 1 and is used to illuminate a desired part of the face panel 1 through a tapered funnel 2. A magnetic device 4 is mounted around the electron gun 3.

In such display devices, the electron gun 3 illuminates the fluorescent screen to display images on the face panel 1 so that a viewer can see the displayed images. Characteristics of the face panel 1 not only determine the quality of the displayed picture but also affect the degree to which the human eyes become fatigued.

One of the conventional methods of alleviating the eye fatigue from viewing the above-mentioned displayed images involves forming a rough surface 5 on the face panel 1 as by etching as shown in FIG. 7. Another method is to coat the surface of the face panel 1 with small particles 6 of, say, silicon to make it rough, as shown in FIG. 8. These methods are intended to scatter the external rays of light reflected by the face panel 1 and thereby reduce the glare.

These display devices, however, have problems that the images are not clearly focused on the face panel surface because of the rough surface 5 and that intense external light would reduce the contrast of the picture.

To avoid these problems, it is common practice to mount a filter on the display surface of the face panel 1 of the display device. One example of such a filter, though not shown, is formed of a single black meshed screen coated with carbon on its surface. This filter is able to reduce glare to some extent because external incident light is absorbed by the black meshed screen. The carbon on the meshed screen also provides a shield against electromagnetic radiation from the display device.

Another example of the conventional filter 10 is above in FIG. 9, in which a meshed screen 8 is sandwiched between transparent bases 7, 7 with one outer surface of the base 7 roughened at 9 by etching. The filter of this kind has the advantages of preventing glare by scattering the external rays of light by the roughened surface 9 of the base 7 and of shielding the electromagnetic radiation.

Although the above-mentioned conventional filter with a single meshed screen can improve the contrast of pictures over the display device with its face panel surface roughened, it has a difficulty in effectively reducing the glare caused by external light because the main object of this filter is to provide a shield against radio waves.

As to the second example of filter 10 shown in FIG. 9 in which the meshed screen 8 is embedded between the two transparent bases 7, it has an insufficient capability of reducing the glare though it provides a good electromagnetic shield, as with the first example. In addition, since the meshed screen 8 is embedded between the bases 7, this filter is unable to effectively improve the picture contrast by the meshed screen 8.

This invention has been accomplished to overcome these drawbacks, and its objective is to provide a filter for display devices that can not only effectively prevent glare from reflected external light but also heighten the contrast of pictures. Another object is to provide the method of manufacturing such a filter.

SUMMARY OF THE INVENTION

To achieve the above objective, a display filter according to this invention comprises: a transparent base; a meshed screen embedded in one side of the base; and a number of indented portions formed in said one side of the base where the meshed screen is embedded, said indented portions being surrounded by the individual meshes of the meshed screen; whereby external light radiated against the filter is scattered by the indented portions, thus eliminating the unwanted glare.

A method of this invention for manufacturing a display filter mounted on the display surface of such display devices as CRT, comprises the steps of: putting a meshed screen on one side of a transparent base; heating the meshed screen and pressing it against the transparent base to embed the meshed screen in the base; heating the transparent base; deforming the heated base into a convex shape so that the side of the base where the meshed screen is embedded is expanded; and cooling the base while it is kept in the convex shape to form a number of indented portions on the meshed screen side of the base, surrounded by the individual meshes of the meshed screen, so that unwanted glare can be eliminated by scattering the external light by the indented portions.

With this invention, since the external light radiated against the surface of the filter is scattered by the dent portions of the base and is not reflected at the meshed screen portion, the glare is significantly reduced. Furthermore, since the meshed screen is formed on one side of the base, the contrast of the picture can be improved drastically.

DESCRIPTION OF THE PREFERRED EMBODIMENT

One embodiment of this invention will now be described by referring to FIGS. 1 to 5.

Figure 1:
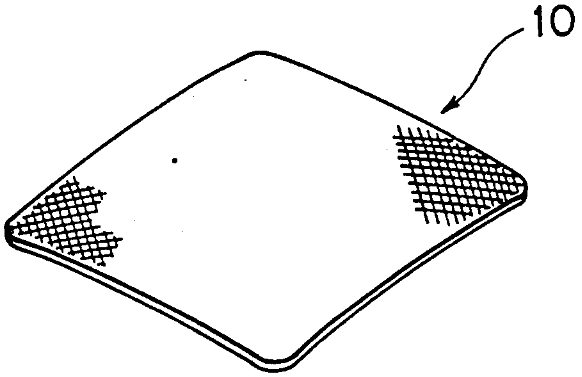
FIG. 1 is a perspective view of the filter as one embodiment of this invention.
Figure 2:
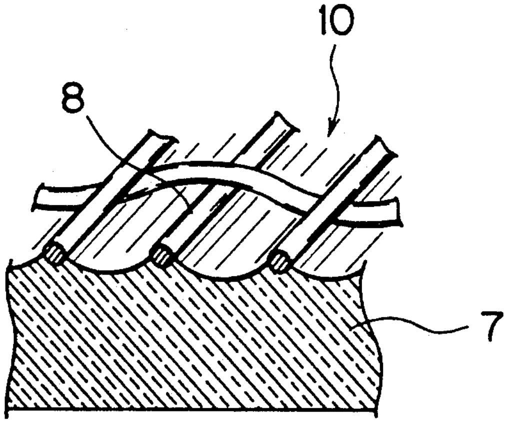
FIG. 2 is an enlarged perspective view of one portion of FIG. 1.
Figure 5:
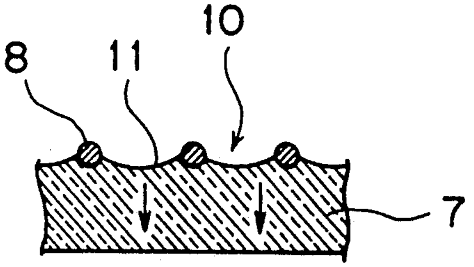
FIG. 5 is a partial schematic diagram showing the base of the filter being shrunk.

FIGS. 1 and 2 show one embodiment of the filter for display devices according to this invention. In this embodiment the filter consists of a base 7 of transparent thermoplastic resin such as acrylics and a black meshed screen 8 embedded in the surface of the base 7. The black meshed screen 8 is formed of such resins as polyester and nylon and has carbon coated on its surface. In each of the meshes of the screen 8 there is formed a dent portion 11 on the base 7.

Figure 4:
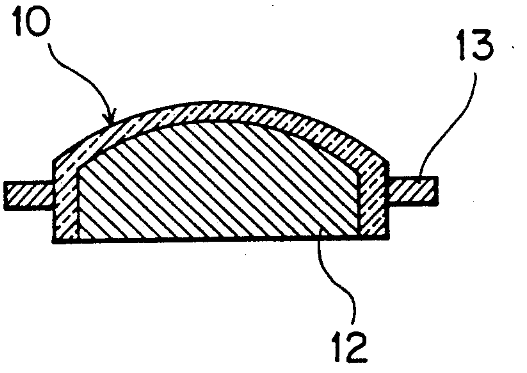
FIG. 4 is a vertical cross sectional view of the filter being formed by the device of FIG. 3.
Figure 3:
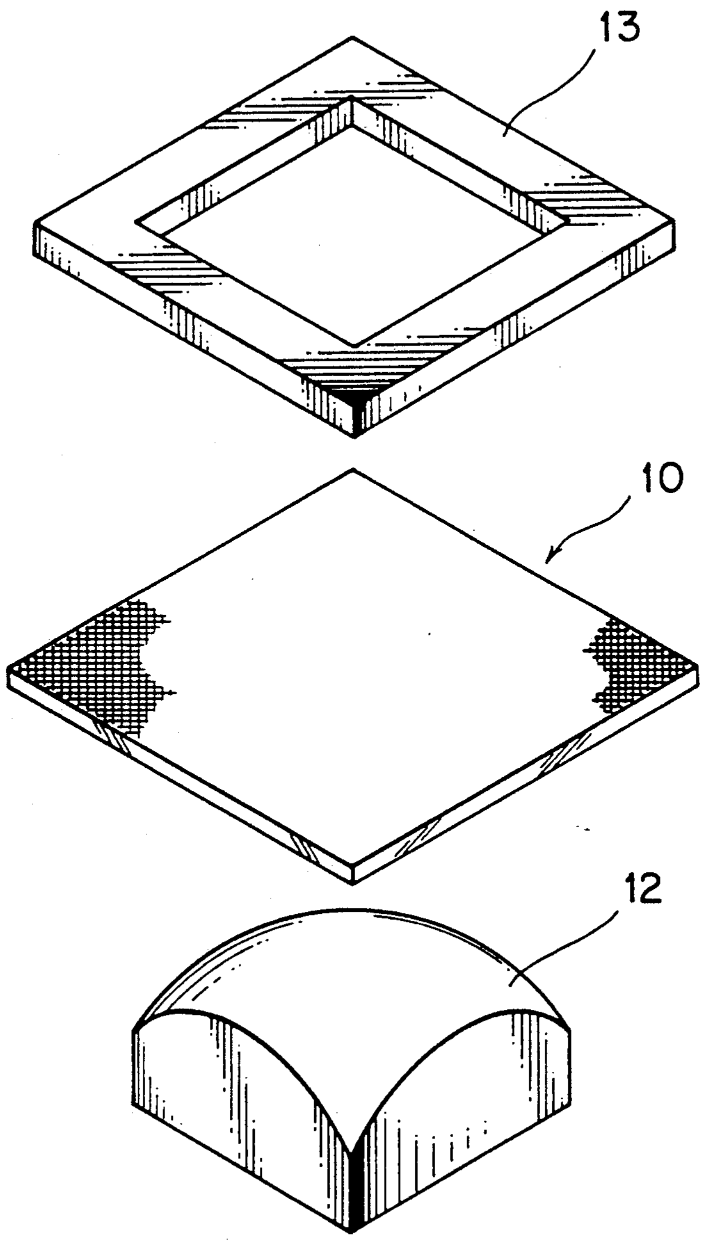
FIG. 3 is an exploded perspective view of a device for manufacturing the filter of this invention.
Figure 6:
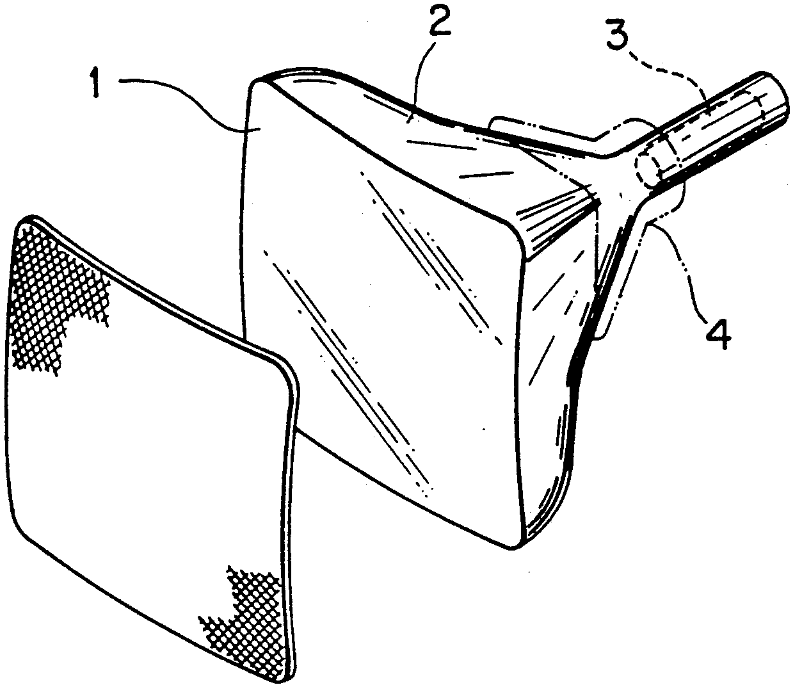
FIG. 6 is a perspective view of a commonly used conventional display device.
Figure 7:
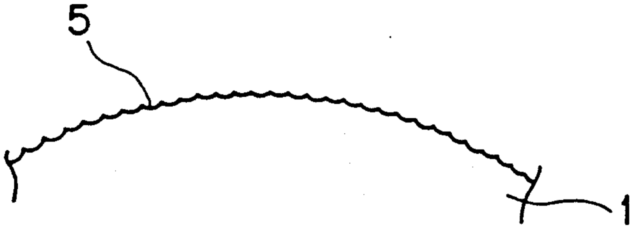
PRIOR ART FIG. 7
FIGS. 7 and 8 are schematic diagrams showing the surfaces of the conventional display devices applied with conventional glare prevention treatments.
Figure 8:
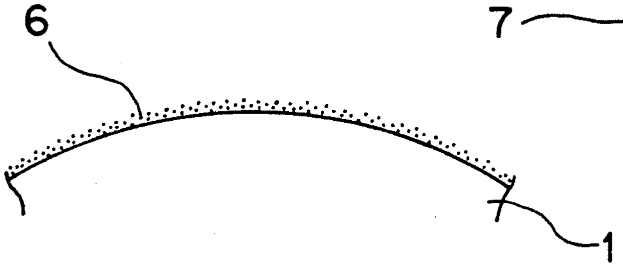
PRIOR ART FIG. 8
Figure 9:
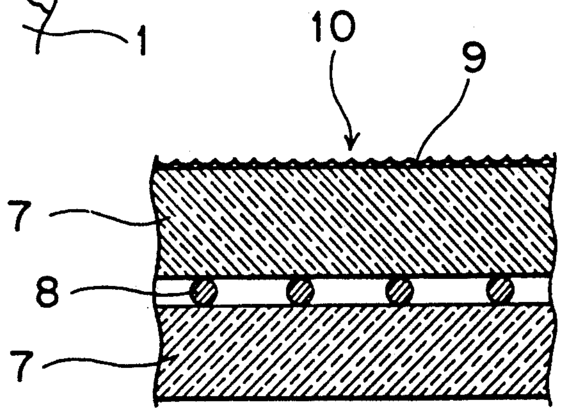
PRIOR ART FIG. 9
FIG. 9 is a vertical cross section of a conventional filter.

The above filter 10 is fabricated as follows. First, the meshed screen 8 is placed on one side of the base 7, and then heated and pressed against the base 7 so that the meshed screen 8 is embedded in one side of the base 7. Where the base 7 is made of acrylics, the base 7 is further heated at 90° C. to 120° C. (thermal deformation temperature). The heated base 7 is then placed on a lower die 12—whose upper central portion is bulged—in such a way that the meshed screen 8 is on the upper side, as shown in FIG. 3 and 4, so as for the whole base 7 to be pressed against the lower die 12. Then a retainer frame 13 is clamped on the bent outer circumferential part of the base 7. Held by the retainer frame 13 in this way, the base 7 is gradually cooled for several minutes. With the meshed screen side of the base 7 kept bulged outwardly as it is cooled, the areas of the base 7 surrounded by the meshes shrink in the direction of arrow in FIG. 5 because of different heat shrinkage coefficients of the base 7 and the meshed screen 8, thereby forming an indented portion 11 in the base 7 in each of the meshes.

In a cathode ray tube with the above filter 10, when external light is radiated against the surface of the filter 10, it is scattered by the dent portions 11 of the base 7 and is absorbed where there is a meshed screen 8, greatly reducing the unwanted glare. Since the meshed screen 8 is formed on one side of the base 7 and partially exposed therefrom and since it is formed black, there is a significant improvement in the contrast of the displayed picture. Furthermore, the carbon adhering to the meshed screen 8 can effectively contain the electromagnetic radiation from the display device.

It should be noted that this invention is not limited to the above embodiment alone and that various modifications may be made as required without departing the spirit of the invention.

The advantages of the invention may be summarized as follows. A meshed screen is embedded in one of the sides of the base as they are heated. The laminated base is then warped and is held in its deformed condition as it is slowly cooled. This process produces a number of indented portions in the base, surrounded by the individual meshes. The dent portions thus formed in the base scatter the external light radiated against the filter surface. Where there is the meshed screen, there is no reflection of the light. These two facts contribute to reducing the glare by a significant amount. Moreover, the black meshes formed on one side of the base provide a substantial improvement in the contrast of displayed images.

What is claimed is:

1. A display filter which is mounted on the display surface of such display devices as CRT, comprising:

a transparent base;

a meshes screen embedded in one side of the base, said one side being open to the ambient atmosphere; and a number of indented portions formed in said one side of the base where the meshed screen is embedded, said indented portions being surrounded by the individual meshes of the meshed screen;

whereby external light radiated against the filter is scattered by the indented portions, thus eliminating the unwanted glare.

2. A method of manufacturing a display filter mounted on the display surface of such display devices as CRT, comprising the steps of:

putting a meshed screen on one side of a transparent base, said one side being open to the ambient atmosphere;

heating the meshed screen and pressing it against the transparent base to embed the meshed screen in the base;

heating the transparent base;

deforming the heated base into a convex shape so that the side of the base where the meshed screen is embedded is expanded; and cooling the base while it is kept in the convex shape to form a number of indented portions on the meshed screen side of the base, surrounded by the individual meshes of the meshed screen, so that unwanted glare can be eliminated by scattering the external light by the indented portions.

3. The method of manufacturing a display filter mounted on the display surface as claimed in claim 2, wherein said deforming operation in which the heated base is deformed into a convex shape is performed by:

placing the heated base on a die — whose upper central portion is bulged — with the meshed screen thereof on the upper side;

pressing the whole base against the lower die; and clamping the bent outer circumferential part of the base by a retainer frame.

* * * * *